United States Patent [19]

Klank et al.

[11] 4,075,567
[45] Feb. 21, 1978

[54] BROADCAST RECEIVER TUNING CIRCUIT WITH STATION MEMORY

[75] Inventors: Otto Klank, Arpke; Dieter Rottmann, Misburg, both of Germany

[73] Assignee: Licentia Patent-Verwaltungs-G.m.b.H., Frankfurt am Main, Germany

[21] Appl. No.: 753,082

[22] Filed: Dec. 21, 1976

[30] Foreign Application Priority Data

Dec. 22, 1975 Germany .............................. 2557856

[51] Int. Cl.² ............................................ H04B 1/16
[52] U.S. Cl. ................................... 325/453; 325/419; 325/457; 325/464
[58] Field of Search ..................... 325/419–421, 325/452, 453, 455, 457, 458, 459, 464, 465, 468, 470; 358/191, 192

[56] References Cited

U.S. PATENT DOCUMENTS

| 3,961,266 | 6/1976 | Tanaka | 325/468 |
| 3,965,336 | 6/1976 | Grohmann | 325/455 |
| 3,988,681 | 10/1976 | Schurmann | 325/464 |

Primary Examiner—Robert L. Griffin
Assistant Examiner—Jin F. Ng

Attorney, Agent, or Firm—Spencer & Kaye

[57] ABSTRACT

A tuning circuit for a high frequency receiver in which the received frequency is determined by a voltage-controlled oscillator, the present tuning frequency is indicated by a counter connected to the oscillator and producing a representation of each digit of the decimal number identifying the current received frequency, representations of the digits of the number identifying the desired received frequency are fed in via a keyboard and stored in a dynamic memory having a feedback connection from its last memory cell to its first memory cell, the decimal number representations are compared in a comparator to produce a control voltage that brings the oscillator frequency to the desired value, the comparator being capable of comparing only one digit of the number representations at a time and being associated with multiplex circuitry which supplies the digits of corresponding significance thereto in sequence, starting with the most significant digit, and a station tuning memory is provided to store representations of the frequency and band of selected broadcast stations and is connected by a linkage circuit to the dynamic memory to permit transfer in either direction between the memories of station frequency and band representations.

17 Claims, 16 Drawing Figures

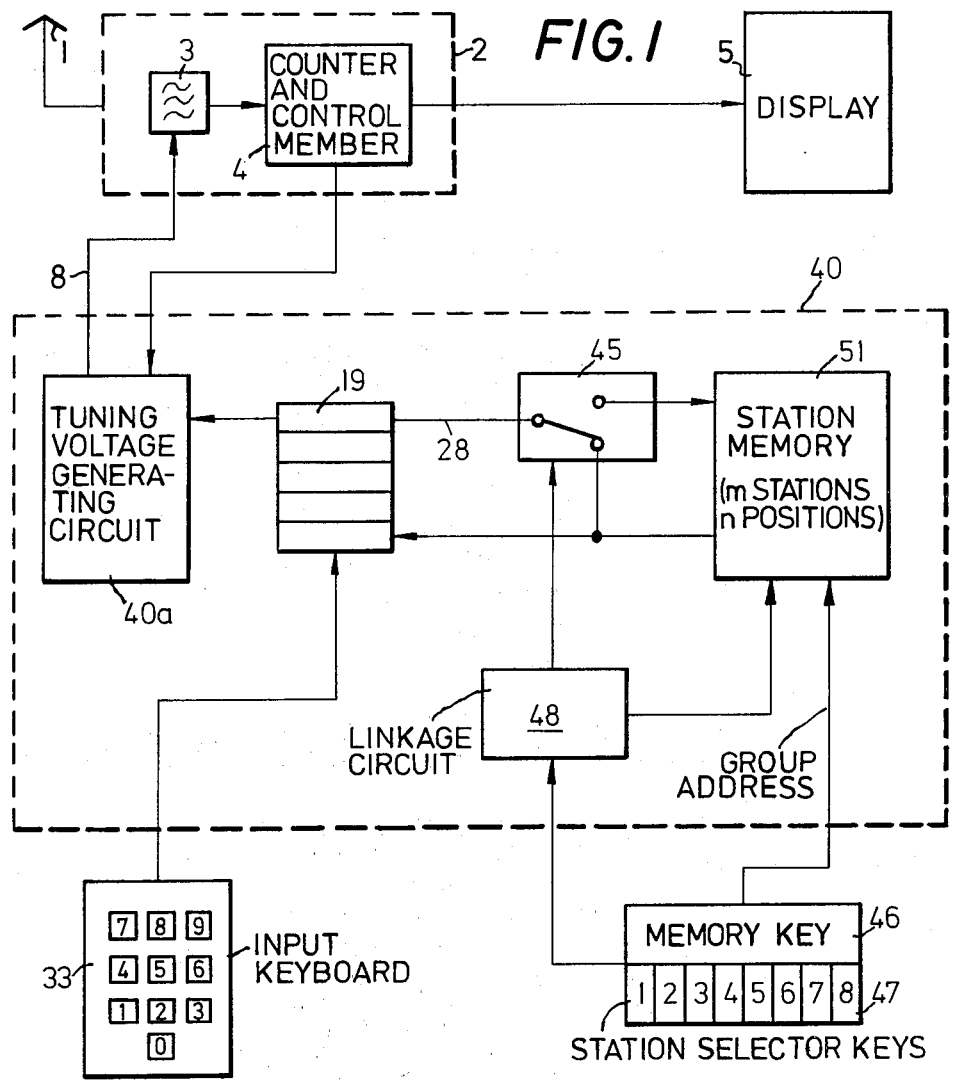
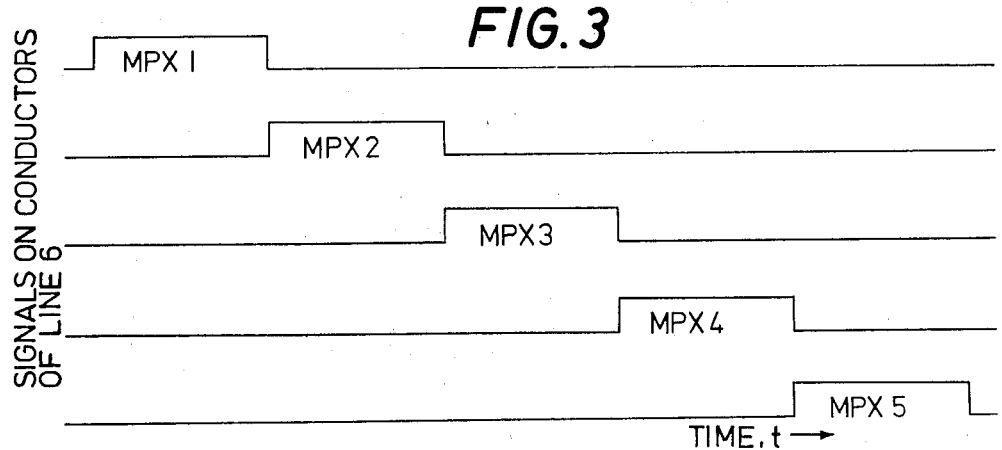

FIG.2

FIG.5a [MPX 1 | MPX 2 | MPX 3 | MPX 4 | MPX 5]

FIG.5b  LINE 42

FIG.5c  LINE 55

FIG.5d  SHIFT PULSES = ENABLING PULSES

FIG.5e  MEMORY LOCATIONS
1-4  5-8  9-12  13-16  17-20
LINE 52 (ADDRESSES)

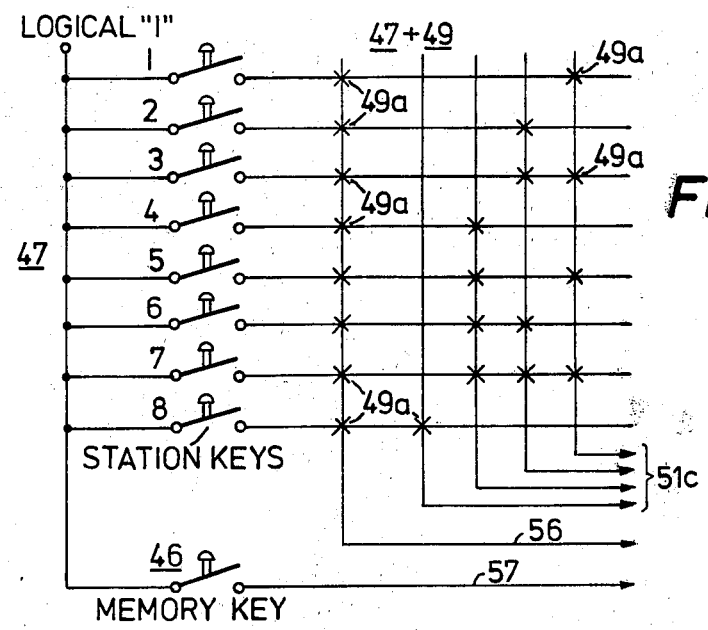
FIG. 7
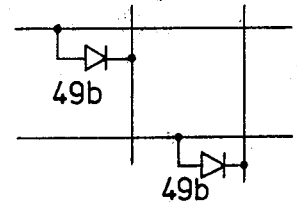
FIG. 8
FIG. 9a
FIG. 9b
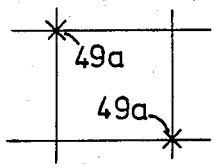 = 

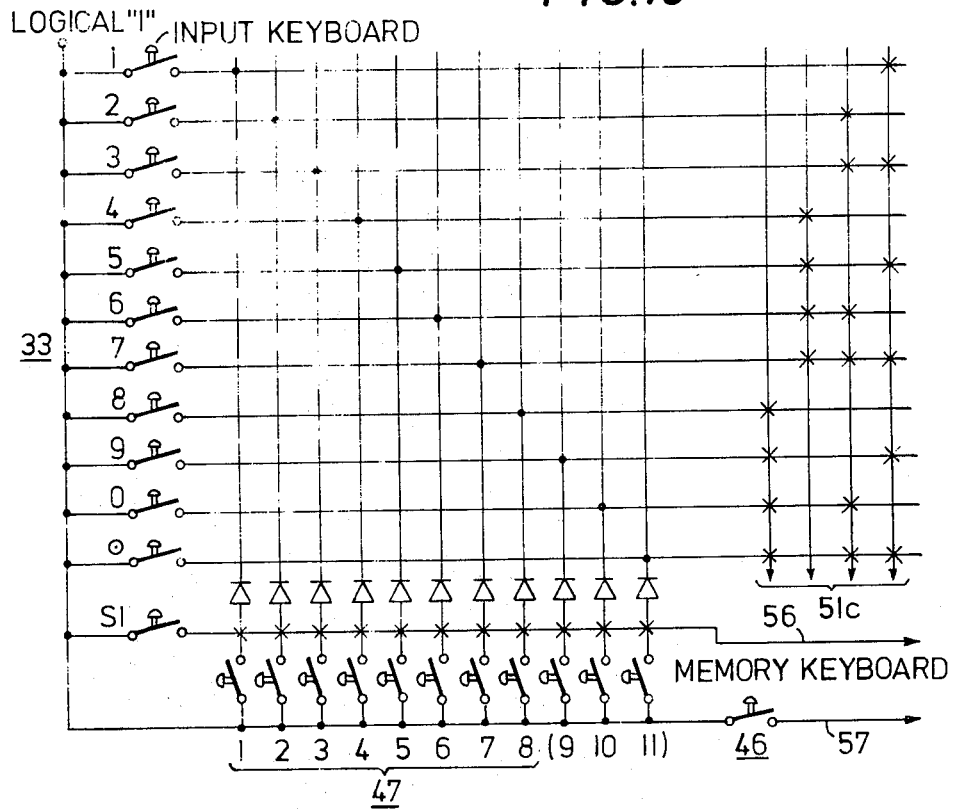
FIG.10
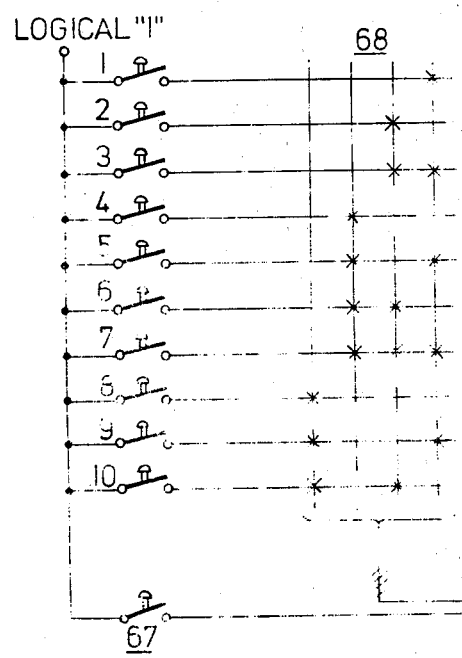
FIG.11
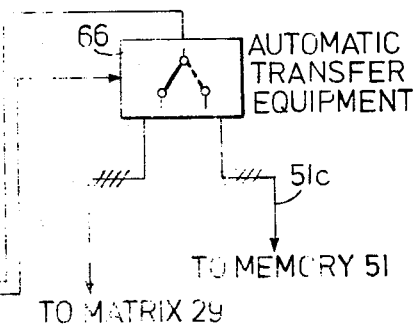

BROADCAST RECEIVER TUNING CIRCUIT WITH STATION MEMORY

BACKGROUND OF THE INVENTION

The present invention relates to a tuning circuit for broadcast receivers, particularly of the type employing a digital input keyboard for reading in of the desired tuning frequency and circuitry for internally storing the information for timing to preselected stations.

U.S. Application Ser. No. 708,754, filed by Otto Klank, Dieter Rottmann and Stephan Wuttke on July 26th, 1976, discloses a tuning circuit for high frequency, broadcast, receivers which includes a voltage controlled superheterodyne oscillator whose frequency can be varied by means of a tuning voltage to tune the receiver to a desired station. The tuning circuit includes a comparison circuit which compares representations of the digits of two numbers to produce the tuning voltage. One of the numbers represents the counting state of a counter which periodically counts the oscillations of the superheterodyne oscillator bearing a fixed relation to the intermediate frequency. This number thus constitutes the value of the received frequency. The other number is fed to the comparison circuit via an input keyboard provided with a series-connected coder. By punching appropriate keys of the input keyboard, that number which represents the station to which the set is to be tuned is introduced into the tuning circuit. From the deviation between the two numbers, as determined in the comparison circuit, the tuning voltage is derived to tune the receiver to the station represented by the other number.

In the tuning circuit disclosed in the above-cited pending application, a single comparator is provided which is capable of comparing the representation of only one digit, or position, of each of the two numbers at a time. This comparator receives the representations of each position, i.e. each order value or significance level, of the two numbers to be compared in succession, in multiplex operation, beginning with the most significant digit of each number, assuming that the two numbers have the same highest order of significance. Multiplex operation offers the advantage, inter alia, that only a few connecting lines are required for the comparison circuit. Moreover, only one memory is required, which in the above-cited pending application is called a circulating memory and is provided with a feedback path from its last memory cell to its first memory cell. The second number fed in via the input keyboard continuously circulates, in coded form, through this memory. From the last cell of the dynamic memory, the digits of the fed-in number reach the comparator.

The above-cited pending application also discloses the possibility of providing a station memory which can be selectively switched into the above-mentioned circulating memory feedback path, the station memory being capable of storing representations of a station frequency and band.

The circuit disclosed in the above-cited pending application incorporates known techniques for tuning receivers by means of a digital input keyboard, with digital frequency indication, of the type disclosed in the periodical "Funkschau", 1974, at pages 62-63 and 93-95.

SUMMARY OF THE INVENTION

It is an object of the present invention to provide an improved circuit arrangement for performing this function.

This and other objects are achieved according to the invention by including, in a tuning circuit having the form described above, a station memory having a plurality of groups of memory locations, each group being arranged to store the data required for tuning to a particular station, a switch member for selectively connecting the station memory in the feedback path of the circulating memory in a manner to permit transfer of data between the memories, an input device for providing signals identifying a particular station memory location group and a station memory write-in operation, and a logic linkage circuit connected between the input device, switch member and station memory for selectively writing data currently in the circulating memory into a particular group of station memory locations or reading into the circulating memory data previously stored in a group of station memory locations.

The input device associated with the station memory, according to the invention, operates to permit selective storage in the station memory of representations circulating through the circulating memory, which representations can include the frequency number and frequency band of the presently received station. These representations can be read out when desired by means of the input device and the linkage circuit and can be transferred into the circulating memory to tune the receiver to the corresponding station. Addressing of the station memory, i.e. the association of station-identifying information with certain memory locations, is effected by means of the input device. This input device is provided, for example, with a plurality of station selector keys each associated with certain memory locations.

BRIEF DESCRIPTION OF THE DRAWING

FIG. 1 is a simplified block circuit diagram of one preferred embodiment of a tuning circuit according to the invention.

FIG. 2 is a detailed block circuit diagram of a specific circuit according to the embodiment of FIG. 1.

FIG. 3 is a set of curves depicting multiplex signals.

FIG. 5 is a set of signal vs. time diagrams illustrating the operation of circuits according to the present invention.

FIG. 7 is a table of coded addresses generated by the circuit of FIG. 6.

FIGS. 8 and 9 show a matrix of coding the station numbers.

FIG. 10 is an embodiment showing the combination of the two coders of FIG. 2 as a single coder;

FIG. 11 is an embodiment showing the combination of the two keyboards of FIG. 2 as a single keyboard.

DESCRIPTION OF THE PREFERRED EMBODIMENTS

Figure 4:
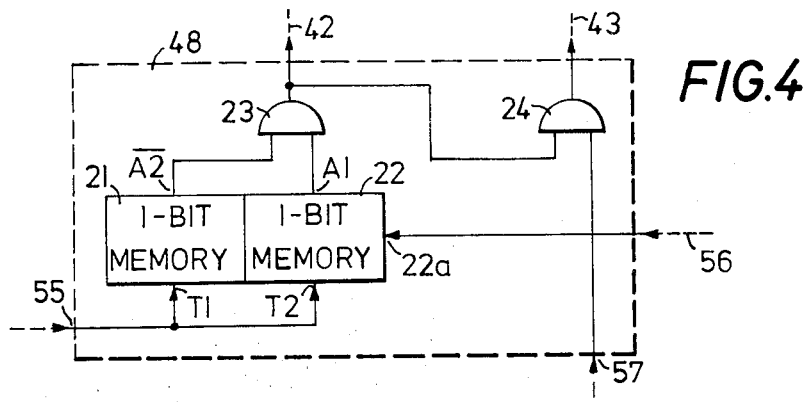
FIG. 4 is a circuit diagram of one embodiment of a linkage circuit constituting a unit of the circuit of FIGS. 1 and 2.

In the operation of the circuit shown in FIG. 1, a high frequency signal received by an antenna 1 is fed to a high frequency receiver 2. The high frequency receiver 2 may be, for example, a radio or television receiver.

The following description is based on a radio receiver, only by way of example. The radio receiver 2 can include, inter alia, a superheterodyne voltage controlled oscillator 3 which produces an intermediate frequency signal. The superheterodyne oscillator 3 is provided with a variable capacitance diode (not shown), permitting the oscillator frequency to be varied by means of a tuning voltage fed to the variable capacitance diode via a line 8 to tune the receiver to the desired station. There is also provided a counting device 4 which includes a counter and a control member. The counter counts the oscillations of the superheterodyne oscillator 3 representative of the intermediate frequency so that the counter state of the counter indicates the currently received frequency or channel. A counting circuit to count the oscillations of the oscillator frequency permitting digital frequency indication is disclosed, for example, in the periodical, "Radio Mentor", 1973, pages 389–390 and the periodical "Funk-Technik", 1971, pages 157–159.

A display device 5 is provided for the digital display of the frequency to which the receiver is tuned, which device includes, for example, 7-segment indicator elements. The digits of the number representing the received frequency are transferred to the display device in a time multiplex manner. The individual digits of the number representing the counter state are thus displayed in rapid succession in time, one after the other.

A representation of the counter state is also fed to a tuning voltage generating circuit 40a where it is compared with a similar representation of a number punched in via an input keyboard 33. The comparison also takes place in a multiplex manner so that, one after the other, beginning with the highest order digit position, corresponding digits of the number identifying the frequency represented by the counter state and of the fed-in number are compared. From the comparison result the tuning voltage for the superheterodyne oscillator 3 is produced to vary its frequency in such a direction that the station identified by the input keyboard is received.

The digits fed in via the input keyboard 33 are fed in succession and in coded, e.g. BCD, form to a circulating, or dynamic, memory 19 which includes, for example, five 4-bit memory cells if there is a maximum of five digits in the number representing a tuning frequency. Initially the first digit fed in is transferred to the first, or lowermost, memory cell of memory 19. While the first digit is shifted into the second memory cell, the second digit is simultaneously stored in the first memory cell, etc. From the last, or uppermost, memory cell each successive digit is fed in succession to the above-mentioned circuit 40a and compared in succession with the corresponding digits of the number identifying the frequency represented by the counter state of the counter of counting device 4 by the same multiplex operation as that employed in the operation of display device 5.

FIG. 1 shows a switch 45 which is schematically shown as a mechanical switch to facilitate understanding but which is preferably an electronic switch. In the illustrated switching state, switch 45 provides a feedback from the fifth to the first memory cells of memory 19. Via this feedback, the digit from the fifth memory cell returns to the first memory cell so that the data transferred into memory 19 constantly circulates. Memory 19 is therefore also called a dynamic memory.

Switch 45 is connected to be actuated by a linkage circuit 48 and can thus be selectively placed in the illustrated switching state or in the opposite switching state. In the latter switching state, switch 45 connects a station memory 51 in series in the feedback path 28. The data, or digit signals, circulating in dynamic memory 19 can then be read into, and stored in, this station memory 51.

The linkage circuit 48 is actuated by an input device 46, 47 which can be operated to provide signals selecting those memory locations of station memory 51 which are to store the data being delivered from dynamic memory 19. The input device 46, 47 is composed of a memory key 46, operation of which actuates the station memory read-in process, as well as station selector keys 47 with which the desired memory locations are addressed. Upon actuation of one of the station selector keys 47, the station memory 51 is switched into the feedback path 28 and that data which is stored in the station memory locations identified by the actuated station selector key 47 is transferred from memory 51 into memory 19.

The station memory 51 is able to store the data required for tuning to $m$ stations, $m$ being, for example, equal to 8, each station being identified by a number having $n$ digits, $n$ being, for example, equal to 5. The storage thus takes place in $m$ groups of which each group has as many memory locations as is required to store the representations of $n$ digits. A suitable station memory could be constituted, for example, by an S 2222 static CMOS random access memory made by the firm AMI (American Microsystems Inc., 3800 Homestead Road, Santa Clara, Ca. 95051).

It is particularly advantageous to provide a so-called nonvolatile memory whose contents are retained even if the operating voltage is switched off. If the number digits are represented in the BCD code in which each digit is represented by four bits, each group has, for example if $n = 5$, 20 memory bit locations.

In FIG. 1 the broken line box indicates the above-mentioned comparison circuit 40. It may be, for example, an integrated MOS circuit and can include, in addition to the circuit portions described in the above-cited pending application, the station memory 51, switch 45, which may be realized by electronic circuitry, and the linkage circuit 48.

Figure 2:
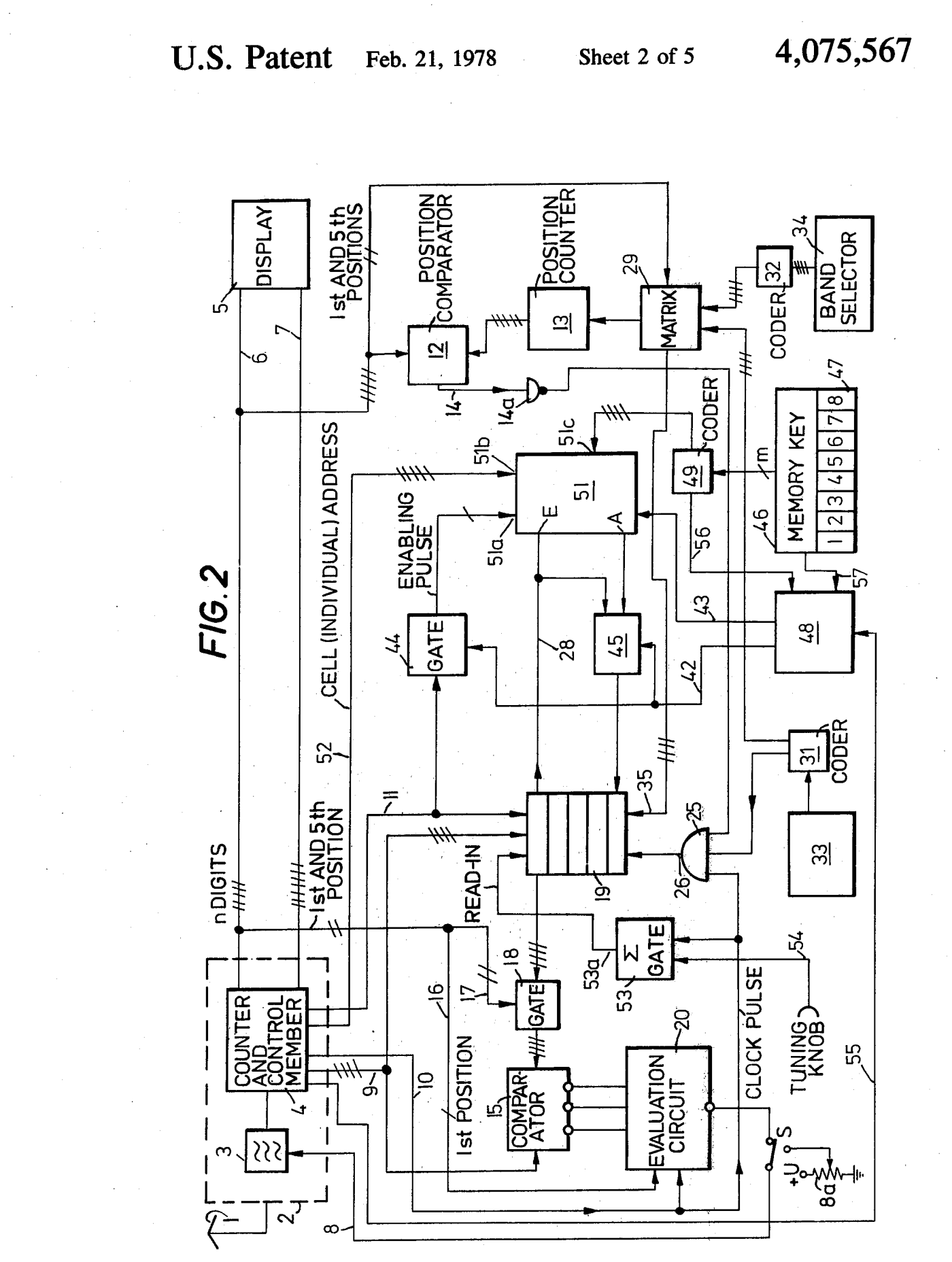

FIG. 2 is a detailed circuit diagram of one specific form of construction of the circuit of FIG. 1. Parts corresponding to one another in FIGS. 1 and 2 bear the same reference numeral. Certain lines shown in FIG. 2 by a single line crossed by a plurality of short slanted lines are constituted by several individual conductors equal in number to the number of slanted lines. It can be seen that the display device 5 is controlled by the counting device 4 via lines 6 and 7 composed of five and seven conductors, respectively. Via line 7 the display device 5 receives, in succession, the digits of the number representative of the counter state of counting device 4 in a 7-segment code. For multiplex operation of display device 5, multiplex signals MPX 1, 2, 3, 4 and 5 whose time relation is shown in FIG. 3 are conducted to the display device 5 via the five conductors of line 6. Each waveform of FIG. 3 shows the signal on a respective conductor of line 6. Each of multiplex signals MPX 1 - MPX 5 activates a respective indicator element associated with a respective decimal digit for which a 7-segment code is being conducted via line 7. Thus a 7-segment code is conducted to each indicator element in succession and multiplex signals MPX 1 - MPX 5 utilize exactly one multiplex cycle to display a complete five-digit number. Multiplex signals MPX 1 - MPX 5 are also called multiplex phases of a multiplex cycle.

The above-mentioned transfer of the digit representations fed in via input keyboard 33 to dynamic memory 19 also takes place in the rhythm of the multiplex signals MPX 1 - MPX 5. The input keyboard 33 is connected in series with a coder 31 which codes each punched-in digit into, for example, BCD code and feeds the resulting code signals into a matrix 29, which can have the form shown in FIG. 7 of the above-cited pending application. From this matrix 29 the coded signals travel via a line 35 to the dynamic memory 19. A setting pulse for effecting transfer of these signals into the first memory cell is obtained from an output 26 of an AND gate 25.

AND gate 25 is controlled via a line 10 by means of clock pulses which occur once per multiplex phase. AND gate 25 additionally receives, via an inverter 14a, a signal delivered via a line 14 from a position comparator 12 which is controlled by the matrix 29 via a position counter 13. Units 12 and 13 can have the form shown in FIG. 2 of the above-cited pending application. In addition, gate 25 receives a sum pulse from coder 31 for every digit fed in via keyboard 33 so that the transfer will take place only when a key has been depressed. Otherwise binary representations of zeroes would continuously be fed in.

The AND conditions for AND gate 25 are selected so that the transfer of a digit representation into the first memory cell of dynamic memory 19 takes place only at certain points in time. These points in time are selected so that the digit representations successively appearing in the fifth memory cell of dynamic memory 19 are fed via a gate 18 to a comparator 15 which can be a four-bit comparator and which also receives, via line 9, the corresponding digit representations from counting device 4. This process is described in detail in the above-cited pending application.

The comparison result from comparator 15 is conducted to an evaluation circuit 20 which produces from the comparison result the desired tuning voltage for the superheterodyne oscillator 3, which is fed to the oscillator via a line 8. The evaluation circuit 20 is controlled, during every multiplex phase, by a clock pulse supplied via line 10 and also by the multiplex signal MPX 1 associated with the highest order, or first, digit position and supplied via line 16. A suitable embodiment of circuit 20 is shown in FIG. 5 of the above-cited pending application.

FIG. 2 shows a frequency band selector 34 for selecting the desired frequency band. The band information is coded by a coder 32 and also fed to matrix 29. From there the band information reaches dynamic memory 19. The data circulating in dynamic memory 19 thus includes the station frequency number fed in via the input keyboard 33 and the band information fed in via the band selector 34. For the purpose of transferring the data from one memory cell of dynamic memory 19 into the next following memory cell, the dynamic memory 19 receives four clock pulses during every multiplex phase via a line 11, which clock pulses are shown in FIG. 5d.

The feedback path 28 of dynamic memory 19 leads to the input E of the station memory 51 and to switch 45. The latter is also connected with the output A of the station memory 51. Switch 45 is controlled by signals applied by linkage circuit 48 via a line 42. Moreover, line 42 is also connected to supply gating signals to a gate 44 which is connected to the clock pulses present on line 11 to a clock pulse input 51a of the station memory to serve as enabling, or read-in, pulses for the memory.

Linkage circuit 48 is also connected with the station memory 51 via a line 43. The signals applied to this line 43 control the mode of operation of the station memory, and in particular control whether data is to be written in or read out. Clock pulses for the linkage circuit 48 which appear at a rate of one pulse per complete multiplex cycle, as shown in FIG. 5c, are supplied via a line 55 from counter 4.

Input device 47, 46 is connected to a coder 49 by a plurality of conductors equal in number to m. The number m represents the number of station selector keys 47, i.e. the number of stations for which identifying data can be stored in memory 51. Coder 49 provides signals to linkage circuit 48 via line 56 to inform the linkage circuit whether a station selector key 47 has been actuated. Additionally, coder 49 codes the number designating the actuated station selector key 47 and feeds it, in BCD form, to an input 51c of the station memory 51 as the address of the group of station memory locations into which the data presently circulating in dynamic memory 19 is to be written and stored.

A plural-conductor line 52 provides representations of successive numbers from 1 to p, obtained from the counting device 4, p being the number of memory locations forming a group for the data to identify one station. If the BCD code is used and with the assumption that five digits are to be stored, $p = 20$. Since five bits are required to represent the number twenty, the line 52 here consists of five individual conductors.

If the input device 46, 47 is not actuated, switch 45 is maintained in such a position that the fifth, or top, memory cell of dynamic memory 19 is connected directly with its first, or bottom, memory cell. This is the mode of operation which is also described in the above-cited pending application. If the station to which the receiver is currently tuned is now to be stored, memory key 46 is initially actuated. This feeds a signal via line 57 to the linkage matrix 48, which then switches station memory 51 so that it will be placed in the "write in" mode if a station selector key 47 is subsequently actuated. Normally, station memory 51 is always enabled to read out stored information. Writing in is possible only if a signal is fed to station memory 51 via line 43. This signal is obtained from linkage circuit 48, as will be described in detail below with reference to FIG. 4, only upon actuation of memory key 46 and subsequent actuation of a station selector key 47 so that station memory 51 can write in and store data during one multiplex cycle in the group of memory locations associated with that selector key 47.

Switching or enabling, respectively, of gate 44 can take place only if, firstly, one of the station selector keys 47 has been actuated, in which event linkage circuit 48 receives a signal from coder 49 via line 56 and, secondly, if a clock pulse signal indicating the beginning of a multiplex cycle reaches linkage circuit 48 via line 55. If thus, for example, upon actuation of memory key 47, the station selector key bearing the number "1" is depressed, this digit is fed by coder 49 in coded form to the input 51c of station memory 51 so that the group assigned to this station selector key 47 is addressed. At the same time, the actuation of station selector key 47 is signalled to linkage circuit 48 by a signal on line 56. At the beginning of a multiplex cycle, gate 44 is enabled by a signal applied via line 42 and switch 45 is switched into the position in which the output A of station memory 51 is connected to a data input of the dynamic memory 19.

Thus, four clock pulses reach clock pulse input 51a of memory 51 through enabled gate 44 during every multiplex phase, as shown in FIG. 5d, to act as enabling pulses so that during every multiplex phase four bits are written into station memory 51 and are returned simultaneously from output A to dynamic memory 19. During successive phases, digit representations are shifted through memory 19. At the same time four successive bit location number representations reach input 51b of station memory 51 during each multiplex phase to indicate the addresses of those memory bit locations in which the four bits are to be stored during each multiplex phase.

Thus, referring to FIG. 5e, during the first multiplex phase MPX 1, the four bits of the first, or highest order, digit are stored in station memory locations 1-4. During the second multiplex phase MPX 2, memory locations 5-8 are used for storage, etc., until, in the fifth multiplex phase, MPX 5, bit representations are stored in memory locations 17-20 of the group. At the end of the fifth multiplex phase, MPX 5, i.e. at the end of one complete multiplex cycle, all data originally in dynamic memory 19 have been written into and stored in station memory 51 and, at the same time have been returned to their original locations in memory 19. Gate 44 is therefore enabled by linkage circuit 48, in response to one actuation of memory key 46, only for the duration of one multiplex cycle. At the end of the multiplex cycle, switch 45 is returned to its original position and age 44 is closed, or blocked, by disappearance of the signal on line 42, so that feedback path 28 now leads directly from the fifth to the first memory cells of dynamic memory 19.

If the set is to be tuned to a station for which tuning information is already stored in dynamic memory 51, the station selector key 47 associated with that stored station must be actuated. If, for example, the station selector key bearing the number "1" is again actuated, switch 45 is switched for the duration of one multiplex cycle so that station memory 51 is again switched into the feedback path 28. At the same time, for the duration of one multiplex cycle, gate 44 is enabled. Station memory 51 is then informed, via coder 49, that the data contained in the memory location group associated with station selector key "1" are to be read out. The mode of operation "read out" is available automatically since memory key 46 has not been actuated.

At the beginning of a multiplex cycle, input 51b again receives representations of the successive addresses of memory locations 1 to 20 so that the bits in memory locations 1 to 20 of the selected group go in succession from output A to dynamic memory 19, each set of four bits first entering into the first memory cell and then being shifted to a next following memory cell with each multiplex phase until, after a complete multiplex cycle, the first group of bits reaches the fifth, or uppermost, memory cell. Reading out, as well as writing in, takes one multiplex cycle.

From the fifth cell of dynamic memory 19 the read-out informations reach comparator 15. The evaluation circuit 20 then produces a tuning voltage from the difference between the stored number representing the frequency of the desired station and the number fed to the comparator by counting device 4, which represents the frequency presently being received, so that the radio receiver 2 is tuned to the station identified by the stored information.

So far it has been assumed that user-controlled tuning to the desired station, i.e. to a station for which information is not presently stored in memory 51, is effected by punching the number representing the frequency of this station into input keyboard 33. It is also possible, however, to tune the radio receiver 2 in the known manner by means of a rotating knob, the rotation of which produces a direct voltage which changes the oscillator frequency of the superheterodyne oscillator 3.

According to an advantageous embodiment of the invention, an arrangement is provided for storing data identifying the station tuned in by turning of a knob in station memory 51. Since the information to be stored is obtained from dynamic memory 19, it is necessary to transfer the counter state of counting device 4, which identifies the station tuned in by means of the tuning knob, initially into dynamic memory 19. For this purpose, the coded digits representing the counter state of counting device 4 are fed via line 9 in succession to the last cell of dynamic memory 19.

For synchronous operation it is necessary that this transfer of the digits into the dynamic memory 19 occur simultaneously with the multiplex signals for multiplex operation. This is accomplished by a sum gate 53 whose output line 53a provides the read-in instruction for the transfer of the individual digit representations of the counter state into the circulating memory 19.

The sum gate 53 is addressed, on the one hand, by a signal from a line 54 which is produced, for example, by actuation, e.g. pushing in, of a tuning knob. Moreover, sum gate 53 receives via line 10 one clock pulse during each multiplex phase, the clock pulses on line 10 also controlling, as mentioned previously, the transfer of the representations of the digit fed in via the input keyboard 33. The representations of the digits of the counter state are transferred to the fifth memory cell of dynamic memory 19 and, due to feedback circuit 28, circulate in dynamic memory 19 in the same manner as the digits fed in through input keyboard 33. Therefore they can be stored in station memory 51 if desired, in the manner described above, and can subsequently be read out from there.

It may happen that during operation of the radio receiver 2 in a certain frequency band it is desired to receive a different station which lies in another frequency band. It could be considered to manually set, by means of band selector 34, that frequency band to which the stored station is assigned before the station selector key is actuated. It is also possible, however, in this case to actuate only the desired station selector key 47 since the stored data also contains the information for the frequency band.

As described in detail in the above-cited pending application, the frequency band information for the frequency bands can be provided by two bits associated with the first and fifth digit positions. For this reason gate 18 is enabled via a line 17 in a manner such that it permits only two bits to pass for the digits of the first and fifth positions since the digit values in the first and fifth positions can always be completely identified by only two bits. It is now possible to separate the frequency band information read out from station memory 51 upon actuation of a station selector key from the digital information and to feed it to a circuit (not shown) which decodes the frequency band information and switches the radio receiver 2 to this frequency band.

According to an advantageous embodiment of the invention, the input information can be fed from the input keyboard 33 and the input device 46, 47 to the comparison circuit 40 (FIG. 1) via a common matrix or a common coder (not shown), respectively, through four lines.

Determination of whether a particular input originates at the input keyboard 33 or the input device 46, 47 can be effected via a further line which contains the memory group information for the station memory 51. In an advantageous manner it is also possible to selectively use the keys of input keyboard 33 as station selector keys so that the separate input device 46, 47 will not be required. In this case a switching device (not shown) is required which determines the current function of the keys of the sole input keyboard 33 and which then also contains the memory key 46.

FIG. 4 shows one preferred embodiment of linkage circuit 48. It includes two 1-bit memories 21 and 22 as well as an AND gate 23 enabled by the direct output A1 of memory 22 and the complement output A2 of memory 21. Moreover, an AND gate 24 is provided which is enabled, on the one hand, by the output of AND gate 23 and, on the other hand, by a signal applied to line 57 by input device 46, 47 whenever memory key 46 has been actuated. Memory 22 has a signal input 22a connected to receive a signal from line 56 if one of the station selector keys 47 has been actuated. The two memories 21 and 22, however, can be set by application of an input signal only if their clock pulse inputs T1 and T2 receive a signal from line 55.

As shown in FIG. 5c, a signal appears on line 55 at the beginning of every complete multiplex cycle. Only at this time can memories 21 and 22 be set. These memories are here connected to operate in a so-called two-phase mode as is customary, for example, with integrated MOS circuits. That means that at first the right-hand memory 22 can be set at the start of a multiplex cycle by a signal at input 22a and during the next multiplex cycle, or clock pulse, on line 55, the left-hand memory 21 is set by the output state of memory 22. AND gate 23 is now controlled by the direct memory output A1 and the inverted memory output A2 so that for the duration of one multiplex cycle a signal appears on line 42, as shown in FIG. 5b, to enable gate 44 and place switch 45 in the state in which output A of memory 51 is connected to the input to the first cell of memory 19. In this case no signal will appear on line 43 at the output of AND gate 24 since there was no actuation of memory key 46 and thus no signal on line 57. Thus, station memory 51 is being operated in "read out" mode.

If information is to be written into station memory 51, memory key 46 must first be actuated. This feeds a signal to one input of AND gate 24. If a station selector key 47 is then actuated, a signal also appears on line 42, in the above-described manner, for the duration of one multiplex cycle and the signal on line 42 is also fed to the other input of AND gate 24. As a result station memory 51 is switched to the "write in" mode for the duration of one multiplex cycle.

Reiterating the showing provided by FIG. 5, FIG. 5a shows the time sequence of multiplex signals MPX 1 to MPX 5, which form a complete multiplex cycle. FIG. 5b shows the signal appearing on line 42 to actuate switch 45 and enable gate 44. FIG. 5c shows the pulses fed to the linkage circuit 48 via line 55 with each multiplex cycle. FIG. 5d shows the shift pulses fed to dynamic memory 19 from device 4 via line 11. It can be seen that four shift pulses appear during each multiplex phase because in the BCD code every digit is represented by four bits. These shift pulses also reach the input 51a of station memory 51 if gate 44 is enabled. They are also called enabling pulses because they permit the writing in or reading out, respectively, of information. One bit is stored or read out, respectively, with every clock pulse.

Figure 6:
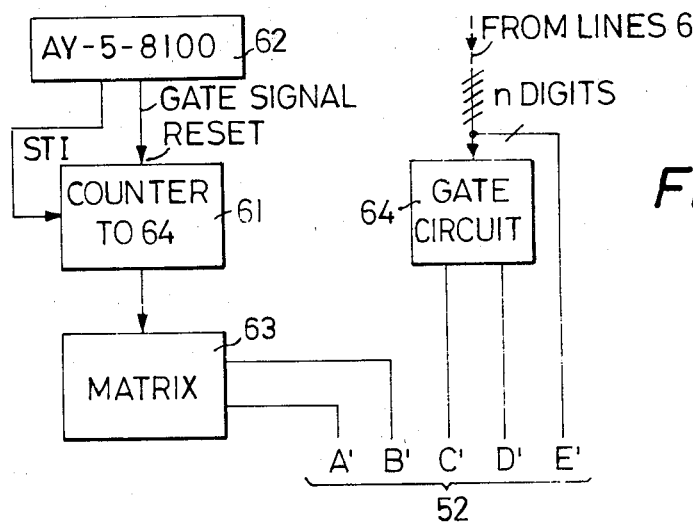
FIG. 6 is a block circuit diagram for producing signals on the line 52.

FIG. 5e shows that representations of the numbers 1–20 are fed to input 51b of station memory 51 during a complete multiplex cycle. These numbers represent the addresses of the memory locations within one memory location group. The lines in FIG. 5e thus do not represent pulses but indicate only that within each multiplex phase four consecutive digits in BCD code are fed to station memory 51. During the first multiplex phase MPX 1 representations of numbers 1 through 4 are transmitted via line 52. Thus, four bits are stored or read out, respectively, in memory locations 1 to 4. During the second multiplex phase MPX 2 the memory locations 5 through 8 are then filled or read out, respectively, etc., until at the end of a complete multiplex cycle twenty bits have been stored or read out, respectively. In the block circuit diagram of FIG. 6 it is shown how the addresses (number zero up to nineteen) for the memory 51 are generated. The counter unit 4 contains the well known MOS-IC 62 of the type AY-5-8100 (General Instruments, Great Britain), which IC gives via a lead STI sixtyfour pulses to a counter 61. In addition the counter 61 which can count up to the number sixtyfour is controlled at its reset-input by the gate signal of the IC 62 whereby the counter 61 always is set to the counter state zero.

The addresses are generated for example in the BCD-code which appears at the five lines A′,B′,C′,D′ and E′. This code is shown in the table in FIG. 7. The logic signals at the leads A′ and B′ are generated by a matrix 63 out of the position of the counter 61. For the generation of the logic signals at the leads C′ and D′ a gate circuit 64 is connected with the leads 6 which are fed to the display 5 as shown in FIG. 2. The logic signals at the lead E′ are directly derived from one of the leads 6.

In FIG. 8 it is shown how the coding of the numbers of the station keys 47 is performed. Each of the numbers one up to eight is for example coded in the BCD-code. Via the leads 51c the coded numbers are fed to the memory 51. The coder 49 is constructed in form of a matrix as shown in FIG. 8 by the horizontal and vertical lines. It is shown by the cross points 49a of two leads crossing each other that these two leads can be connected with each other via a diode 49b as it is shown in FIG. 9a and 9b. If for example the key switch for the number 6 is actuated then at the leads 51c the logic number 0110 occurs which corresponds to the number 6 in the BCD-code. In FIG. 8 there are also shown the memory key 46 as well as the leads 56 and 57.

The coder 32 for coding the band information according to FIG. 2 is also constructed in form of a matrix the principle of which is shown in FIG. 8. The band selection of the receiver 2 can be made in a well known manner, for example mechanically or electronically.

Also the coder 31 for the coding of the numbers given in is constructed according to the principle of the matrix shown in FIG. 8. Both the coder 31 and the coder 49 solve the same problem, that is to code into the BCD-code those numbers which belong to the key of the input keyboard 33 and to the station selector keys 47. In FIG. 10 there is shown how the coders 31 and 49 can be combined in an advantageous manner in a single matrix. The keys 33 are connected directly, and the keys 47 are connected via diodes, with the code matrix. The decision whether the numbers at the leads 51c shall be fed to the matrix 29 or to the memory 51 is made by a signal at the lead 56 or by the key switch S1 respectively. The cross points in FIG. 10 have the same function as in FIGS. 9a and 9b.

It is also possible to provide instead of said two keyboard units 33 and 47 only a single keyboard unit which can be used both as input keyboard 33 and as station selector keys 47 respectively. One example to this solution is shown in FIG. 11. The coded numbers of the matrix 68 are fed to an automatic transfer equipment 66 which connects the matrix 68 (which itself functions as a coder) either with the matrix 29 or with the memory 51. For example the key switches 1 – 10 have the function of a keyboard for giving in the numbers, the key switch 67 being non-conductive so that the coded signals are fed to the matrix 29. If the key switch 67 is closed, that is conductive, the coded signals are fed from the matrix 68 to the memory 51. In this case the key switches 1 – 10 serve as station selector keys.

It should be mentioned that the tuning of the receiver can also be performed in a known manner manually if in FIG. 2 the switch S is brought into that position which is not shown in the figure. The tuning voltage for the variable capacitance diodes is derived in this case from the variable tap of the potentiometer 8a which is connected to a stabilized operating voltage +U.

It will be understood that the above description of the present invention is susceptible to various modifications, changes and adaptations, and the same are intended to be comprehended within the meaning and range of equivalents of the appended claims.

What is claimed is:

1. In a tuning circuit for a high frequency broadcast receiver, which circuit includes a voltage controllable superheterodyne oscillator arranged to receive a control voltage and to produce an oscillation whose frequency is determined by the value of the control voltage and determines the broadcast frequency to which the receiver is tuned, a counter connected to sense the frequency of the oscillations being generated by the oscillator and to produce therefrom a count state in the form of representations of the digits of a first decimal number identifying the broadcast frequency to which the receiver is currently tuned, input means for generating representations of the digits of a second decimal number identifying the broadcast frequency to which it is desired to tune the receiver, a circulating memory having a plurality of memory cells, including a memory input cell and a memory output cell, for storing a succession of digit representations and having an input connected to the input means for receiving the representations of successive digits of the second number and a feedback path connected for causing the representations in the memory output cell to be conducted back to the memory input cell and a comparison circuit for comparing the decimal number representations being produced by the counter and contained in the memory to vary the control voltage in a direction to cause the number representation produced by the counter to coincide with the number representation generated by the input means, the comparison circuit including a single comparator capable of comparing, at one time, only the representations of one digit of each of two numbers, and time multiplex means connected for delivering to the comparator, in succession, each digit representation produced by the counter, starting with the most significant digit, and, simultaneously therewith, each digit representation of corresponding significance generated by the input means, the improvement comprising: a station memory for storing the digit representations completely identifying at least one broadcast frequency, means for selectively connecting said station memory into the feedback path of said circulating memory in a manner to permit transfer of data between said memories; an input unit actuable for providing signals identifying particular station memory locations and initiating a station memory write-in operation; and a logic linkage circuit connected between said input unit and said station memory for selectively writing digit representations currently in said circulating memory into particular station memory locations or reading into said circulating memory digit representations previously stored in particular station memory locations.

2. An arrangement as defined in claim 1 wherein said means for selectively connecting comprises switch means connected between said circulating memory and said station memory and actuable for selectively connecting said station memory into said circulating memory feedback path.

3. An arrangement as defined in claim 2 wherein each of said memories is provided with a clock pulse input for receiving pulses to control transfer of data therethrough, and said tuning circuit further comprises: clock pulse generating means producing a sequence of clock pulses; and a first gate circuit connected between said clock pulse generating means and said station memory clock pulse input for selectively transmitting clock pulses to said station memory clock pulse input.

4. An arrangement as defined in claim 3 wherein said linkage circuit is connected to said switch means and said first gate circuit for controlling the operating states thereof simultaneously.

5. An arrangement as defined in claim 4 wherein said multiplex means are arranged for controlling the delivery of all digit representations of a decimal number during a multiplex cycle composed of a sequence of multiplex phases, and said linkage circuit is connected to said multiplex means for placing said switch means in a state connecting said station memory in said circulating memory feedback path and rendering said first gate conductive during one multiplex cycle upon provision by said input unit of a signal identifying a station memory location group.

6. An arrangement as defined in claim 1 wherein said station memory is composed of a plurality of groups of memory locations, each group having a sufficient number of memory locations to store the digit representations completely identifying one broadcast frequency.

7. Tuning circuit as defined in claim 6 wherein said input unit comprises a plurality of station selector keys each actuable to provide a signal for addressing a respective station memory location group.

8. An arrangement as defined in claim 7 wherein said input unit further comprises a memory key actuable to provide the signal initiating the station memory write-in operation.

9. An arrangement as defined in claim 7 wherein the addresses of successive station memory locations within each said group are represented by successive numbers obtained from said counter in BCD code and fed to said station memory.

10. An arrangement as defined in claim 9 wherein said multiplex means are arranged for controlling the delivery of all digit representations of a decimal number during a multiplex cycle composed of a sequence of multiplex phases and said counter includes means for feeding four of the numbers representing successive station memory locations during each multiplex phase.

11. An arrangement as defined in claim 7 wherein said input means and said input unit are constituted by a common assembly of a matrix and coder means, a plurality of conductors conducting the signals produced by both said input means and said input device, and a conducting line connected to conduct the signals identifying a particular group of station memory locations.

12. An arrangement as defined in claim 11 wherein said common assembly comprises a plurality of digit keys each actuable to generate selectively representations of a digit of the second decimal number or signals identifying a particular group of station memory locations.

13. An arrangement as defined in claim 1 further comprising manual tuning means including a tuning knob operable to produce a tuning voltage and means connected for applying such tuning voltage to said oscillator as a control voltage therefor.

14. An arrangement as defined in claim 13 wherein said counter is arranged to transfer to said circulating memory representations of the count state of said counter identifying the frequency being received due to tuning by operation of said knob.

15. An arrangement as defined in claim 14 wherein said multiplex means are arranged for controlling the delivery of all digit representations of a decimal number during a multiplex cycle composed of a sequence of multiplex phases, and said tuning knob is further operable to produce a logic signal, and wherein said tuning circuit further comprises a sum gate having one input connected to receive the logic signal produced by said knob and connected to said multiplex means to receive one enabling pulse during each multiplex phase, and having an output connected to said circulating memory for controlling transfer of the counter state representations from said counter into said circulating memory.

16. An arrangement as defined in claim 1 wherein said station memory is constituted by a nonvolatile memory.

17. An arrangement as defined in claim 1 further comprising means for simultaneously storing frequency band information in said station memory.

* * * * *